US007974713B2

(12) United States Patent
Disch et al.

(10) Patent No.: US 7,974,713 B2
(45) Date of Patent: Jul. 5, 2011

(54) TEMPORAL AND SPATIAL SHAPING OF MULTI-CHANNEL AUDIO SIGNALS

(75) Inventors: Sascha Disch, Fuerth (DE); Juergen Herre, Buckenhof (DE); Matthias Neusinger, Rohr (DE); Dirk Jeroen Breebaart, Einhoven (NL); Gerard Hotho, Eindhoven (NL)

(73) Assignees: Fraunhofer-Gesellschaft zur Foerderung der Angewandten Forschung E.V., Munich (DE); Koninklijke Philips Electronics N.V., Eindhoven (NL)

( * ) Notice: Subject to any disclaimer, the term of this patent is extended or adjusted under 35 U.S.C. 154(b) by 1527 days.

(21) Appl. No.: 11/363,985

(22) Filed: Feb. 27, 2006

(65) Prior Publication Data

US 2007/0081597 A1 Apr. 12, 2007

(51) Int. Cl.

*G06F 17/00* (2006.01)
*H03M 7/00* (2006.01)
*H04R 5/00* (2006.01)
*G10L 19/00* (2006.01)

(52) U.S. Cl. ............... 700/94; 341/60; 381/19; 704/219

(58) Field of Classification Search .............. 341/60–90; 381/17–23; 700/94; 704/219, 262, 500
See application file for complete search history.

(56) References Cited

U.S. PATENT DOCUMENTS 5,701,346 A * 12/1997 Herre et al. ..................... 381/18
5,812,971 A * 9/1998 Herre ............................ 704/230
6,032,081 A 2/2000 Han et al.
6,131,084 A 10/2000 Hardwick
6,424,939 B1 * 7/2002 Herre et al. .................. 704/219
6,539,357 B1 3/2003 Sinha
2002/0067834 A1 * 6/2002 Shirayanagi .................... 381/20
2003/0219130 A1 * 11/2003 Baumgarte et al. ............. 381/17
2004/0138886 A1 * 7/2004 Absar et al. .................. 704/240
2005/0007262 A1 1/2005 Craven et al.

(Continued)

FOREIGN PATENT DOCUMENTS

EP 1385150 A1 1/2004

(Continued)

OTHER PUBLICATIONS

Schuijers, Erik, et al., “Advances in Parametric Coding for High-Quality Audio”, Mar. 2003, Audio Engineering Society, all pages.*

(Continued)

*Primary Examiner* — Curtis Kuntz
*Assistant Examiner* — Jesse A Elbin
(74) *Attorney, Agent, or Firm* — Michael A. Glenn; Glenn Patent Group

(57) ABSTRACT

A selected channel of a multi-channel signal represented by frames composed from sampling values having a high time resolution is provided that can be encoded with higher quality when a wave form parameter representation representing a wave form of an intermediate resolution representation of the selected channel is derived. The wave form parameter representation with the intermediate resolution can be used to shape a reconstructed channel to retrieve a channel having a signal envelope close to a selected original channel. The time scale on which the shaping is performed is shorter than the time scale of a framewise processing, thus enhancing the quality of the reconstructed channel. On the other hand, the shaping time scale is larger than the time scale of the sampling values, significantly reducing the amount of data needed by the wave form parameter representation.

22 Claims, 10 Drawing Sheets

U.S. PATENT DOCUMENTS

| | | | | |
|---|---|---|---|---|
| 2005/0216262 | A1* | 9/2005 | Fejzo | 704/217 |
| 2007/0162278 | A1 | 7/2007 | Miyasaka et al. | |

FOREIGN PATENT DOCUMENTS

| | | | |
|---|---|---|---|
| EP | 1565036 | A2 | 8/2005 |
| TW | 561451 | | 11/2003 |
| TW | I226035 | | 1/2005 |
| TW | I226601 | | 1/2005 |
| TW | I229318 | | 3/2005 |
| WO | WO2004/072956 | | 8/2004 |

OTHER PUBLICATIONS

English Translation of Taiwanese Search and Examination Report mailed on Jul. 7, 2009 for patent application No. 095133901; 7 pages.

J. Herre, et al., "The Reference Model Architecture for MPEG Spatial Audio Coding", *Audio Engineering Society Convention Paper 6447 presented at the 118th Convention*, May 28-31, 2005, Barcelona, Spain, XP009059973, pp. 1-13.

Villemoes et al., "MPEG Surround: The Forthcoming ISO Standard for Spatial Audio Coding", *AES 28th International Conference*, Pitea, Sweden, Jun. 30 to Jul. 2, 2006, XP-002405379, pp. 1-18.

Singapore Search and Examination Report for parallel application No. 200802501-7, report dated Mar. 6, 2009.

Report on MPEG Spatial Audio Coding RM0 Listening Tests. Audio subgroup. ISO/IEC JTC 1/SC 29/WG 11/N&138. Apr. 2005. Busan, Korea.

* cited by examiner

FIG 3A 80 82a 82b 80 82a 82b

84

| k | $\bar{K}(k)$ dec Type=0 | $\bar{K}(k)$ dec Type=1 | k | $\bar{K}(k)$ dec Type=0 | $\bar{K}(k)$ dec Type=1 |
|---|---|---|---|---|---|
| 0 | 1 | 0 | 53 | 19 | 15 |
| 1 | 0 | 0 | 54 | 19 | 15 |
| 2 | 0 | 1 | 55 | 19 | 16 |
| 3 | 1 | 1 | 56 | 19 | 16 |
| 4 | 2 | 2 | 57 | 19 | 16 |
| 5 | 3 | 2 | 58 | 19 | 16 |
| 6 | 4 | 3 | 59 | 19 | 17 |
| 7 | 5 | 3 | 60 | 19 | 17 |
| 8 | 6 | 4 | 61 | 19 | 17 |
| 9 | 7 | 4 | 62 | 19 | 17 |
| 10 | 8 | 4 | 63 | 19 | 17 |
| 11 | 9 | 4 | 64 | 19 | 18 |
| 12 | 10 | 1 | 65 | 19 | 18 |
| 13 | 11 | 1 | 66 | 19 | 18 |
| 14 | 12 | 0 | 67 | 19 | 18 |
| 15 | 13 | 0 | 68 | 19 | 18 |
| 16 | 14 | 6 | 69 | 19 | 18 |
| 17 | 14 | 6 | 70 | 19 | 18 |
| 18 | 15 | 3 | 71 | | 18 |
| 19 | 15 | 3 | 72 | | 18 |
| 20 | 15 | 4 | 73 | | 18 |
| 21 | 16 | 4 | 74 | | 18 |
| 22 | 16 | 5 | 75 | | 18 |
| 23 | 16 | 5 | 76 | | 19 |
| 24 | 16 | 6 | 77 | | 19 |
| 25 | 17 | 6 | 78 | | 19 |
| 26 | 17 | 7 | 79 | | 19 |
| 27 | 17 | 7 | 80 | | 19 |
| 28 | 17 | 8 | 81 | | 19 |
| 29 | 17 | 8 | 82 | | 19 |
| 30 | 18 | 5 | 83 | | 19 |
| 31 | 18 | 5 | 84 | | 19 |
| 32 | 18 | 9 | 85 | | 19 |
| 33 | 18 | 7 | 86 | | 19 |
| 34 | 18 | 8 | 87 | | 19 |
| 35 | 18 | 8 | 88 | | 19 |
| 36 | 18 | 9 | 89 | | 19 |
| 37 | 18 | 9 | 90 | | 19 |
| 38 | 18 | 10 | 91 | | 19 |
| 39 | 18 | 8 | 92 | | 19 |
| 40 | 18 | 11 | 93 | | 19 |
| 41 | 18 | 9 | 94 | | 19 |

FIG 3B

| 80 | 82a | 82b | 80 | 82a | 82b |
|---|---|---|---|---|---|
| 42 | 19 | 10 | 95 | | 19 |
| 43 | 19 | 10 | 96 | | 19 |
| 44 | 19 | 11 | 97 | | 19 |
| 45 | 19 | 11 | 98 | | 19 |
| 46 | 19 | 12 | 99 | | 19 |
| 47 | 19 | 10 | 100 | | 19 |
| 48 | 19 | 12 | 101 | | 19 |
| 49 | 19 | 13 | 102 | | 19 |
| 50 | 19 | 14 | 103 | | 19 |
| 51 | 19 | 14 | 104 | | 19 |
| 52 | 19 | 15 | | | |

FIG 4

84 →

| dec Type | 0 | 1 |
|---|---|---|
| $k_0$ | 12 | 40 |

FIG 5

90

| Syntax | No. of bits | Mnemonic |
|---|---|---|
| SpatialSpecificConfig() | | |
| { | | |
| bsSamplingFrequencyIndex; | 4 | uimsbf |
| if ( samplingFrequencyIndex==0xf ) { | | |
| bsSamplingFrecuncy; | 24 | uimsbf |
| } | | |
| bsFrameLength; | 6 | uimsbf |
| bsFreqRes; | 3 | uimsbf |
| bsTreeConfig; | 4 | uimsbf |
| bsQuantMode; | 3 | uimsbf |
| bsOneIcc; | 1 | uimsbf |
| bsArbitraryDownmix; | 1 | uimsbf |
| bsResidualCoding; | 1 | uimsbf |
| bsSmoothConfig; | 4 | uimsbf |
| bsFixedGains; | 4 | uimsbf |
| bsMatrixMode; | 1 | uimsbf |
| bsTempShapeConfig; | 4 | uimsbf |
| bsDecorrConfig; | 4 | uimsbf |
| if (bsTreeConfig==15) { | | |
| TreeDescription(); | | |
| } | | |
| for(i=0; i<numOttBoxes; i++) { | | Note 1 |
| OttConfig(i) | | |
| } | | |
| for(i=0; i<numTttBoxes; i++) { | | Note 1 |
| TttConfig(i) | | |
| } | | |
| if(bsResidualCoding) { | | |
| bsResidualSamplingFrequencyindex; | 4 | uimsbf |
| bsResidualFramesPerSpatialFrame; | 2 | uimsbf |
| for(i=0; i<numOttBoxes+numTttBoxes; i++) { | | Note 1 |
| ResidualConfig(i); | | |
| } | | |
| } | | |
| if ((bsTempShape Config>=4)&& (bsTempShapeConfig<8)) { | | |
| bsEnvQuantMode | 3 | uimsbf |
| } | | |
| /*SOME CONTAINER FOR LATER EXTENSIONS SHOULD GO HERE*/ | | |
| } | | |
| Note 1: numOttBoxes and numTttBoxes are defined dependent on bsTreeConfig. | | |

92

FIG 6

| bsTempSampleConfig | Meaning |
|---|---|
| 0 | use TP without whitening if available in decoder, otherwise use TES |
| 1 | use TP with whitening if available in decoder, otherwise use TES |
| 2 | only TES (even if TP available in decoder) |
| 3 | no temporal shaping |
| 4..7 | same as 0...3, combined with guided envelope shaping |
| 8..15 | reserved |

94

FIG 7

| Syntax | No. of bits | Mnemonic |
|---|---|---|
| TempShapeData() | | |
| { | | |
| psTempShapeEnable; | 1 | uimsbf |
| if (bsTempShapeEnable) { | | |
| for (oc=0; oc<numOutChan; oc++) { | | |
| bsTempShapeEnableChannel[oc]; | 1 | uimsbf |
| } | | |
| } | | |
| if ((bsTempShapeConfig>=4)&&(bsTempShapeConfig<8)) { | | |
| EnvelopeReshapeHuff(numOutChan, numTimeSlots) | | |
| } | | |
| } | | |

100 (psTempShapeEnable … bsTempShapeEnableChannel[oc])

102 (if ((bsTempShapeConfig>=4)&&(bsTempShapeConfig<8)) … })

FIG 8

| Syntax | No. of bits | Mnemonic |
|---|---|---|
| EnvelopeReshapeHuff( numOutChan; numTimeSlots ) | | |
| { | | |
| for (i=0; i<numOutChan; i++) { | | |
| bsEnvShapeChannel; | 1 | uimsbf |
| if (bsEnvShapeChannel) { | | |
| numValRcvd=0; | | |
| while (numValRcvd<numTimeSlots) { | | |
| (erVal, erLen)=2Dhuff_dec(hcod2D_EnvRes, bsCodeW); | 1...x | vlclbf |
| for (k=numValRcvd; k<numValRcvd+erLen; k++) { | | |
| envShapeData[i][k]=erVal; | | |
| } | | |
| numValRcvd+=erLen; | | |
| } | | |
| } | | |
| } | | |
| return envShapeData; | | |
| } | | |

104

106

FIG 7B

| bsEnvQuantMode | Meaning |
|---|---|
| 0 | 5-step quantizer |
| 1..7 | reserved |

FIG 9

110 114 112 110 114 112

Table A1 - hcod2D_EnvRes

| erVal | erLen | lenght | codeword | erVal | erLen | lenght | codeword |
|---|---|---|---|---|---|---|---|
| -2 | 1 | 5 | 0x006 | 0 | 5 | 5 | 0x007 |
| -2 | 2 | 6 | 0x01e | 0 | 6 | 6 | 0x03a |
| -2 | 3 | 8 | 0x0f8 | 0 | 7 | 6 | 0x01f |
| -2 | 4 | 9 | 0x1f2 | 0 | 8 | 5 | 0x01e |
| -2 | 5 | 10 | 0x3e6 | 1 | 1 | 3 | 0x002 |
| -2 | 6 | 11 | 0x7ce | 1 | 2 | 4 | 0x006 |
| -2 | 7 | 11 | 0x17e | 1 | 3 | 5 | 0x004 |
| -2 | 8 | 10 | 0x3ee | 1 | 4 | 7 | 0x07e |
| -1 | 1 | 3 | 0x004 | 1 | 5 | 8 | 0x0fa |
| -1 | 2 | 4 | 0x00a | 1 | 6 | 9 | 0x1f6 |
| -1 | 3 | 5 | 0x00e | 1 | 7 | 10 | 0x3ff |
| -1 | 4 | 6 | 0x00a | 1 | 8 | 9 | 0x05e |
| -1 | 5 | 7 | 0x016 | 2 | 1 | 6 | 0x03b |
| -1 | 6 | 9 | 0x1fe | 2 | 2 | 8 | 0x0fe |
| -1 | 7 | 10 | 0x3fe | 2 | 3 | 9 | 0x05d |
| -1 | 8 | 9 | 0x05c | 2 | 4 | 10 | 0x0be |
| 0 | 1 | 3 | 0x006 | 2 | 5 | 11 | 0x17f |
| 0 | 2 | 3 | 0x000 | 2 | 6 | 12 | 0xf9e |
| 0 | 3 | 4 | 0x00b | 2 | 7 | 12 | 0xf9f |
| 0 | 4 | 5 | 0x01c | 2 | 8 | 10 | 0x3ef |

FIG 10

120 122

| *oc* | *X* |
|---|---|
| 0 | L |
| 1 | R |
| 2 | C |
| 3 | Lfe |
| 4 | Ls |
| 5 | Rs |

TEMPORAL AND SPATIAL SHAPING OF MULTI-CHANNEL AUDIO SIGNALS

FIELD OF THE INVENTION

The present invention relates to coding of multi-channel audio signals and in particular to a concept to improve the spatial perception of a reconstructed multi-channel signal.

BACKGROUND OF THE INVENTION AND PRIOR ART

Recent development in audio coding has made available the ability to recreate a multi-channel representation of an audio signal based on a stereo (or mono) signal and corresponding control data. These methods differ substantially from older matrix based solutions such as Dolby Prologic, since additional control data is transmitted to control the re-creation, also referred to as up-mix, of the surround channels based on the transmitted mono or stereo channels.

Hence, the parametric multi-channel audio decoders reconstruct N channels based on M transmitted channels, where N>M, and based on the additional control data. The additional control data represents a significant lower data rate than transmitting all N channels, making the coding very efficient while at the same time ensuring compatibility with both M channel devices and N channel devices. The M channels can either be a single mono, a stereo, or a 5.1 channel representation. Hence, it is possible to have e.g. a 7.2 channel original signal down mixed to a 5.1 channel backwards compatible signal, and spatial audio parameters enabling a spatial audio decoder to re-produce a closely resembling version of the original 7.2 channels, at a small additional bit rate overhead.

These parametric surround-coding methods usually comprise a parameterisation of the surround signal based on ILD (Inter channel Level Difference) and ICC (Inter Channel Coherence). These parameters describe e.g. power ratios and correlation between channel pairs of the original multi-channel signal. In the decoding process, the re-created multi-channel signal is obtained by distributing the energy of the received downmix channels between all the channel pairs described by the transmitted ILD parameters. However, since a multi-channel signal can have equal power distribution between all channels, while the signals in the different channels are very different, thus giving the listening impression of a very wide (diffuse) sound, the correct wideness (diffuseness) is obtained by mixing the signals with decorrelated versions of the same. This mixing is described by the ICC parameter. The decorrelated version of the signal is obtained by passing the signal through an all-pass filter such as a reverberator.

This means that the decorrelated version of the signal is created on the decoder side and is not, like the downmix channels, transmitted from the encoder to the decoder. The output signals from the all-pass filters (decorrelators) have a time-response that is usually very flat. Hence, a dirac input signal gives a decaying noise-burst out. Therefore, when mixing the decorrelated and the original signal, it is for some signal types such as dense transients (applause signals) important to shape the time envelope of the decorrelated signal to better match that of the down-mix channel, which is often also called dry signal. Failing to do so will result in a perception of larger room size and unnatural sounding transient signals. Having transient signals and a reverberator as all-pass filter, even echo-type artefacts can be introduced when shaping of the decorrelated (wet) signals is omitted.

From a technical point of view, one of the key challenges in reconstructing multi-channel signals, as for example within a MPEG sound synthesis, consists in the proper re-production of multi-channel signals with a very wide sound image. Technically speaking, this corresponds to the generation of several signals with low inter-channel correlation (or coherence), but still tightly control spectral and temporal envelopes. Examples for such signals are "applause" items, which exhibit both a high degree of decorrelation and sharp transient events (claps). As a consequence, these items are most critical for the MPEG surround technology which is for example elaborated in more detail in the "Report on MPEG Spatial Audio Coding RM0 Listening Tests", ISO/IEC JTC1/SC29/WG11 (MPEG), Document N7138, Busan, Korea, 2005". Generally previous work has focused on a number of aspects relating to the optimal reproduction of wide/diffuse signals, such as applause by providing solutions that 1. adapt the temporal (and spectral) shape of the decorrelated signal to that of the transmitted downmix signal in order to prevent pre-echo—like artefacts (note: this does not require sending any side information from the spatial audio encoder to the spatial audio decoder).
2. adapt the temporal envelopes of the synthesized output channels to their original envelope shapes (present at the input of the corresponding encoder) using side information that describes the temporal envelopes of the original input signals and which is transmitted from the spatial audio encoder to the spatial audio decoder.

Currently, the MPEG Surround Reference Model already contains several tools supporting the coding of such signals, e.g.

Time Domain Temporal Shaping (TP)

Temporal Envelope Shaping (TES)

In an MPEG Surround synthesis system, decorrelated sound is generated and mixed with the "dry" signal in order to control the correlation of the synthesized output channels according to the transmitted ICC values. From here onwards, the decorrelated signal will be referred to as 'diffuse' signal, although the term 'diffuse' reflects properties of the reconstructed spatial sound field rather than properties of a signal itself. For transient signals, the diffuse sound generated in the decoder does not automatically match the fine temporal shape of the dry signals and does not fuse well perceptually with the dry signal. This results in poor transient reproduction, in analogy to the "pre-echo problem" which is known from perceptual audio coding. The TP tool implementing Time Domain Temporal Shaping is designed to address this problem by processing of the diffuse sound.

The TP tool is applied in the time domain, as illustrated in FIG. 14. It basically consists of a temporal envelope estimation of dry and diffuse signals with a higher temporal resolution than that provided by the filter bank of a MPEG Surround coder. The diffuse signal is re-scaled in its temporal envelope to match the envelope of the dry signal. This results in a significant increase in sound quality for critical transient signals with a broad spatial image/low correlation between channel signals, such as applause.

The envelope shaping (adjusting the temporal evolution of the energy contained within a channel) is done by matching the normalized short time energy of the wet signal to that one of the dry signal. This is achieved by means of a time varying gain function that is applied to the diffuse signal, such that the time envelope of the diffuse signal is shaped to match that one of the dry signal.

Note that this does not require any side information to be transmitted from the encoder to the decoder in order to process the temporal envelope of the signal (only control information for selectively enabling/disabling TP is transmitted by the surround encoder).

FIG. 14 illustrates the time domain temporal shaping, as applied within MPEG surround coding. A direct signal 10 and a diffuse signal 12 which is to be shaped are the signals to be processed, both supplied in a filterbank domain. Within MPEG surround, optionally a residual signal 14 may be available that is added to the direct signal 10 still within the filter bank domain. In the special case of an MPEG surround decoder, only high frequency parts of the diffuse signal 12 are shaped, therefore the low-frequency parts 16 of the signal are added to the direct signal 10 within the filter bank domain.

The direct signal 10 and the diffuse signal 12 are separately converted into the time domain by filter bank synthesis devices 18*a*, and 18*b*. The actual time domain temporal shaping is performed after the synthesis filterbank. Since only the high-frequency parts of the diffuse signal 12 are to be shaped, the time domain representations of the direct signal 10 and the diffuse signal 12 are input into high pass filters 20*a* and 20*b* that guarantee that only the high-frequency portions of the signals are used in the following filtering steps. A subsequent spectral whitening of the signals may be performed in spectral whiteners 22*a* and 22*b* to assure that the amplitude (energy) ratios of the full spectral range of the signals are accounted for in the following envelope estimation 24 which compares the ratio of the energies that are contained in the direct signal and in the diffuse signal within a given time portion. This time portion is usually defined by the frame length. The envelope estimation 24 has as an output a scale factor 26, that is applied to the diffuse signal 12 in the envelope shaping 28 in the time domain to guarantee that the signal envelope is basically the same for the diffuse signal 12 and the direct signal 10 within each frame.

Finally, the envelope shaped diffuse signal is again high-pass filtered by a high-pass filter 29 to guarantee that no artefacts of lower frequency bands are contained in the envelope shaped diffuse signal. The combination of the direct signal and the diffuse signal is performed by an adder 30. The output signal 32 then contains signal parts of the direct signal 10 and of the diffuse signal 12, wherein the diffuse signal was envelope shaped to assure that the signal envelope is basically the same for the diffuse signal 12 and the direct signal 10 before the combination.

The problem of precise control of the temporal shape of the diffuse sound can also be addressed by the so-called Temporal Envelope Shaping (TES) tool, which is designed to be a low complexity alternative to the Temporal Processing (TP) tool. While TP operates in the time domain by a time-domain scaling of the diffuse sound envelope, the TES approach achieves the same principal effect by controlling the diffuse sound envelope in a spectral domain representation. This is done similar to the Temporal Noise Shaping (TNS) approach, as it is known from MPEG-2/4 Advanced Audio Coding (AAC). Manipulation of the diffuse sound fine temporal envelope is achieved by convolution of its spectral coefficients across frequency with a suitable shaping filter derived from an LPC analysis of spectral coefficients of the dry signal. Due to the quite high time resolution of the MPEG Surround filter bank, TES processing requires only low-order filtering (1st order complex prediction) and is thus low in its computational complexity. On the other hand, due to limitations e.g. related to temporal aliasing, it cannot provide the full extent of temporal control that the TP tool offers.

Note that, similarly to the case of TP, TES does not require any side information to be transmitted from the encoder to the decoder in order to describe the temporal envelope of the signal.

Both tools, TP and TES, successfully address the problem of temporal shaping of the diffuse sound by adapting its temporal shape to that of the transmitted down mix signal. While this avoids the pre-echo type of unmasking, it cannot compensate for a second type of deficiency in the multi-channel output signal, which is due to the lack of spatial re-distribution:

An applause signal consists of a dense mixture of transient events (claps) several of which typically fall into the same parameter frame. Clearly, not all claps in a frame originate from the same (or similar) spatial direction. For the MPEG Surround decoder, however, the temporal granularity of the decoder is largely determined by the frame size and the parameter slot temporal granularity. Thus, after synthesis, all claps that fall into a frame appear with the same spatial orientation (level distribution between output channels) in contrast to the original signal for which each clap may be localized (and, in fact, perceived) individually.

In order to also achieve good results in terms of spatial redistribution of highly critical signals such as applause signals, the time-envelopes of the upmixed signal need to be shaped with a very high time resolution.

SUMMARY OF THE INVENTION

It is the object of the present invention to provide a concept for coding multi-channel audio signals that allows efficient coding providing an improved preservation of the multi-channel signals spatial distribution.

In accordance with the first aspect of the present invention, this object is achieved by a decoder for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, comprising: an upmixer for generating a plurality of up mixed channels having a time resolution higher than the intermediate resolution; and a shaper for shaping a selected upmixed channel using the intermediate waveform parameters of the selected original channel corresponding to the selected upmixed channel.

In accordance with a second aspect of the present invention, this object is achieved by an encoder for generating a wave form parameter representation of a channel of a multi-channel signal represented by frames, a frame comprising sampling values having a sampling period, the encoder comprising: a time resolution decreaser for deriving a low resolution representation of the channel using the sampling values of a frame, the low resolution representation having low resolution values having associated a low resolution period being larger than the sampling period; and a wave form parameter calculator for calculating the wave form parameter representation representing a wave form of the low resolution representation, wherein the wave form parameter calculator is adapted to generate a sequence of wave form parameters having a time resolution lower than a time resolution of the sampling values and higher than a time resolution defined by a frame repetition rate.

In accordance with a third aspect of the present invention, this object is achieved by a method for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, the method comprising: generating a plurality of upmixed channels having a time resolution higher than the intermediate resolution; and shaping a selected upmixed channel using the intermediate waveform parameters of the selected original channel corresponding to the selected upmixed channel.

In accordance with a fourth aspect of the present invention, this object is achieved by a method for generating a wave form parameter representation of a channel of a multi-channel signal represented by frames, a frame comprising sampling values having a sampling period, the method comprising: deriving a low resolution representation of the channel using the sampling values of a frame, the low resolution representation having low resolution values having associated a low resolution period being larger than the sampling period; and calculating the wave form parameter representation representing a wave form of the low resolution representation, wherein the wave form parameter calculator is adapted to generate a sequence of wave form parameters having a time resolution lower than a time resolution of the sampling values and higher than a time resolution defined by a frame repetition rate.

In accordance with a fifth aspect of the present invention, this object is achieved by a representation of a multi-channel audio signal based on a base signal derived from the multi-channel audio signal having one or more channels, the number of channels of the base signal being smaller than the number of channels of the multi-channel signal, the base signal being organized in frames, a frame comprising sampling values having a high resolution, and based on a wave form parameter representation representing a wave form of an intermediate resolution representation of a selected channel of the multi-channel signal, the wave form parameter representation including a sequence of intermediate wave form parameters having a time resolution lower than the high time resolution of the sampling values and higher than a low time resolution defined by a frame repetition rate.

In accordance with a sixth aspect of the present invention, this object is achieved by a computer readable storage medium, having stored thereon a representation of a multi-channel audio signal based on a base signal derived from the multi-channel audio signal having one or more channels, the number of channels of the base signal being smaller than the number of channels of the multi-channel signal, the base signal being organized in frames, a frame comprising sampling values having a high resolution, and based on a wave form parameter representation representing a wave form of an intermediate resolution representation of a selected channel of the multi-channel signal, the wave form parameter representation including a sequence of intermediate wave form parameters having a time resolution lower than the high time resolution of the sampling values and higher than a low time resolution defined by a frame repetition rate.

In accordance with a seventh aspect of the present invention, this object is achieved by a receiver or audio player having a decoder for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, comprising: an upmixer for generating a plurality of upmixed channels having a time resolution higher than the intermediate resolution; and a shaper for shaping a selected upmixed channel using the intermediate waveform parameters of the selected original channel corresponding to the selected upmixed channel.

In accordance with an eighth aspect of the present invention, this object is achieved by a transmitter or audio recorder having an encoder for generating a wave form parameter representation of a channel of a multi-channel signal represented by frames, a frame comprising sampling values having a sampling period, the encoder comprising: a time resolution decreaser for deriving a low resolution representation of the channel using the sampling values of a frame, the low resolution representation having low resolution values having associated a low resolution period being larger than the sampling period; and a wave form parameter calculator for calculating the wave form parameter representation representing a wave form of the low resolution representation, wherein the wave form parameter calculator is adapted to generate a sequence of wave form parameters having a time resolution lower than a time resolution of the sampling values and higher than a time resolution defined by a frame repetition rate.

In accordance with a ninth aspect of the present invention, this object is achieved by a method of receiving or audio playing, the method having a method for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, the method comprising: generating a plurality of upmixed channels having a time resolution higher than the intermediate resolution; and shaping a selected upmixed channel using the intermediate waveform parameters of the selected original channel corresponding to the selected upmixed channel.

In accordance with a tenth aspect of the present invention, this object is achieved by a method of transmitting or audio recording, the method having a method for generating a wave form parameter representation of a channel of a multi-channel signal represented by frames, a frame comprising sampling values having a sampling period, the method comprising: deriving a low resolution representation of the channel using the sampling values of a frame, the low resolution representation having low resolution values having associated a low resolution period being larger than the sampling period; and calculating the wave form parameter representation representing a wave form of the low resolution representation, wherein the wave form parameter calculator is adapted to generate a sequence of wave form parameters having a time resolution lower than a time resolution of the sampling values and higher than a time resolution defined by a frame repetition rate.

In accordance with a eleventh aspect of the present invention, this object is achieved by a transmission system having a transmitter and a receiver, the transmitter having an encoder for generating a wave form parameter representation of a channel of a multi-channel signal represented by frames, a frame comprising sampling values having a sampling period; and the receiver having a decoder for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate.

In accordance with a twelfth aspect of the present invention, this object is achieved by a method of transmitting and receiving, the method of transmitting having a method for generating a wave form parameter representation of a channel of a multi-channel signal represented by frames, a frame comprising sampling values having a sampling period; and the method of receiving having a method for generating a multi-channel output signal based on a base signal derived from an original multi-channel signal having one or more channels, the number of channels of the base signal being smaller than the number of channels of the original multi-channel signal, the base signal being organized in frames, a frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, the method comprising.

In accordance with a thirteenth aspect of the present invention, this object is achieved by a computer program having a program code for, when running a computer, performing any of the above methods.

The present invention is based on the finding that a selected channel of a multi-channel signal which is represented by frames composed from sampling values having a high time resolution can be encoded with higher quality when a wave form parameter representation representing a wave form of an intermediate resolution representation of the selected channel is derived, the wave form parameter representation including a sequence of intermediate wave form parameters having a time resolution lower than the high time resolution of the sampling values and higher than a time resolution defined by a frame repetition rate. The wave form parameter representation with the intermediate resolution can be used to shape a reconstructed channel to retrieve a channel having a signal envelope close to that one of the selected original channel. The time scale on which the shaping is performed is finer than the time scale of a framewise processing, thus enhancing the quality of the reconstructed channel. On the other hand, the shaping time scale is coarser than the time scale of the sampling values, significantly reducing the amount of data needed by the wave form parameter representation.

A waveform parameter representation being suited for envelope shaping may in a preferred embodiment of the present invention contain a signal strength measure as parameters which is indicating the strength of the signal within a sampling period. Since the signal strength is highly related to the perceptual loudness of a signal, using signal strength parameters is therefore a suited choice for implementing envelope shaping. Two natural signal strength parameters are for example the amplitude or the squared amplitude, i.e. the energy of the signal.

The present invention aims for providing a mechanism to recover the signals spatial distribution on a high temporal granularity and thus recover the full sensation of "spatial distribution" as it is relevant e.g. for applause signals. An important side condition is that the improved rendering performance is achieved without an unacceptably high increase in transmitted control information (surround side information).

The present invention described in the subsequent paragraphs primarily relates to multi-channel reconstruction of audio signals based on an available down-mix signal and additional control data. Spatial parameters are extracted on the encoder side representing the multi-channel characteristics with respect to a (given) down-mix of the original channels. The down mix signal and the spatial representation is used in a decoder to recreate a closely resembling representation of the original multi-channel signal by means of distributing a combination of the down-mix signal and a decorrelated version of the same to the channels being reconstructed.

The invention is applicable in systems where a backwards-compatible down-mix signal is desirable, such as stereo digital radio transmission (DAB, XM satellite radio, etc.), but also in systems that require very compact representation of the multi-channel signal. In the following paragraphs, the present invention is described in its application within the MPEG surround audio standard. It goes without saying that it is also applicable within other multi-channel audio coding systems, as for example the ones mentioned above.

The present invention is based on the following considerations:

For optimal perceptual audio quality, an MPEG Surround synthesis stage must not only provide means for decorrelation, but also be able to re-synthesize the signal's spatial distribution on a fine temporal granularity.

This requires the transmission of surround side information representing the spatial distribution (channel envelopes) of the multi-channel signal.

In order to minimize the required bit rate for a transmission of the individual temporal channel envelopes, this information is coded in a normalized and related fashion relative to the envelope of the down mix signal. An additional entropy-coding step follows to further reduce the bit rate required for the envelope transmission.

In accordance with this information, the MPEG Surround decoder shapes both the direct and the diffuse sound (or the combined direct/diffuse sound) such that it matches the temporal target envelope. This enables the independent control of the individual channel envelopes and recreates the perception of spatial distribution at a fine temporal granularity, which closely resembles the original (rather than frame-based, low resolution spatial processing by means of decorrelation techniques only).

The principle of guided envelope shaping can be applied in both the spectral and the time domain wherein the implementation in the spectral domain feature's lower computational complexity.

In one embodiment of the present invention a selected channel of a multi-channel signal is represented by a parametric representation describing the envelope of the channel, wherein the channel is represented by frames of sampling values having a high sampling rate, i.e. a high time resolution. The envelope is being defined as the temporal evolution of the energy contained in the channel, wherein the envelope is typically computed for a time interval corresponding to the frame length. In the present invention, the time slice for which a single parameter represents the envelope is decreased with respect to the time scale defined by a frame, i.e. this time slice is an intermediate time interval being longer than the sampling interval and shorter than the frame length. To achieve this, a intermediate resolution representation of the selected channel is computed that describes a frame with reduced temporal resolution compared to the resolution provided by the sampling parameters. The envelope of the selected channel is estimated with the time resolution of the low resolution representation which, on the one hand, increases the temporal resolution of the lower resolution representation and, on the other hand, decreases the amount of data and the computational complexity that is needed compared to a shaping in the time domain.

In a preferred embodiment of the present invention the intermediate resolution representation of the selected channel is provided by a filter bank that derives a down-sampled filter bank representation of the selected channel. In the filter bank representation each channel is split into a number of finite frequency bands, each frequency band being represented by a number of sampling values that describe the temporal evolution of the signal within the selected frequency band with a time resolution that is smaller than the time resolution of the sampling values.

The application of the present invention in the filter bank domain has a number of great advantages. The implementation fits well into existing coding schemes, i.e. the present invention can be implemented fully backwards compatible to existing audio coding schemes, such as MPEG surround audio coding. Furthermore, the required reduction of the temporal resolution is provided automatically by the down-sampling properties of the filter bank and a whitening of a spectrum can be implemented with much lower computational complexity in the filter bank domain than in the time domain. A further advantage is that the inventive concept may only be applied to frequency parts of the selected channel that need the shaping from a perceptual quality point of view.

In a further preferred embodiment of the present invention a waveform parameter representation of a selected channel is derived describing a ratio between the envelope of the selected channel and the envelope of a down-mix signal derived on the encoder side. Deriving the waveform parameter representation based on a differential or relative estimate of the envelopes has the major advantage of further reducing the bit rate demanded by the waveform parameter representation. In a further preferred embodiment the so-derived waveform parameter representation is quantized to further reduce the bit rate needed by the waveform parameter representation. It is furthermore most advantageous to apply an entropy coding to the quantized parameters for saving more bit rate without further loss of information.

In a further preferred embodiment of the present invention the wave form parameters are based on energy measures describing the energy contained in the selected channel for a given time portion. The energy is preferably calculated as the squared sum of the sampling parameters describing the selected channel.

In a further embodiment of the present invention the inventive concept of deriving a waveform parameter representation based on a intermediate resolution representation of a selected audio channel of a multi-channel audio signal is implemented in the time domain. The required deriving of the intermediate resolution representation can be achieved by computing the (squared) average or energy sum of a number of consecutive sampling values. The variation of the number of consecutive sampling values which are averaged allows convenient adjustment of the time resolution of the envelope shaping process. In a modification of the previously described embodiment only every n-th sampling value is used for the deriving of the waveform parameter representation, further decreasing the computational complexity.

In a further embodiment of the present invention the deriving of the shaping parameters is performed with comparatively low computational complexity in the frequency domain wherein the actual shaping, i.e. the application of the shaping parameters is performed in the time domain.

In a further embodiment of the present invention the envelope shaping is applied only on those portions of the selected channel that do require an envelope shaping with high temporal resolution.

The present invention described in the previous paragraphs yields the following advantages:

- Improvement of spatial sound quality of dense transient sounds, such as applause signals, which currently can be considered worst-case signals.
- Only moderate increase in spatial audio side information rate (approximately 5 kbit/s for continuous transmission of envelopes) due to very compact coding of the envelope information.
- The overall bit rate might be furthermore reduced by letting the encoder transmit envelopes only when it is perceptually necessary. The proposed syntax of the envelope bit stream element takes care of that.

The inventive concept can be described as guided envelope shaping and shall shortly be summarized within the following paragraphs:

The guided envelope shaping restores the broadband envelope of the synthesized output signal by envelope flattening and reshaping of each output channel using parametric broadband envelope side information contained in the bit stream.

For the reshaping process the envelopes of the downmix and the output channels are extracted. To obtain these envelopes, the energies for each parameter band and each slot are calculated. Subsequently, a spectral whitening operation is performed, in which the energy values of each parameter band are weighted, so that the total energy of all parameter bands is equal. Finally, the broadband envelope is obtained by summing and normalizing the weighted energies of all parameter bands and a long term averaged energy is obtained by low pass filtering with a long time constant.

The envelope reshaping process performs flattening and reshaping of the output channels towards the target envelope, by calculating and applying a gain curve on the direct and the diffuse sound portion of each output channel. Therefore, the envelopes of the transmitted down mix and the respective output channel are extracted as described above.

The gain curve is then obtained by scaling the ratio of the extracted down mix envelope and the extracted output envelope with the envelope ratio values transmitted in the bit stream.

The proposed envelope shaping tool uses quantized side information transmitted in the bit stream. The total bit rate demand for the envelope side information is listed in Table 1 (assuming 44.1 kHz sampling rate, 5 step quantized envelope side information).

TABLE 1

Estimated bitrate for envelope side information

| coding method | estimated bitrate |
|---|---|
| Grouped PCM Coding | ~8.0 kBit/s |
| Entropy Coding | ~5.0 kBit/s |

As stated before the guided temporal envelope shaping addresses issues that are orthogonal to those addressed by TES or TP: While the proposed guided temporal envelope shaping aims at improving spatial distribution of transient events, the TES and the TP tool is functional to shape the diffuse sound envelope to match the dry envelope. Thus, for a high quality application scenario, a combination of the newly proposed tool with TES or TP is recommended. For optimal performance, guided temporal envelope shaping is performed before application of TES or TP in the decoder tool chain. Furthermore the TES and the TP tools are slightly adapted in their configuration to seamlessly integrate with the proposed tool: Basically, the signal used to derive the target envelope in TES or TP processing is changed from using the down mix signal towards using the reshaped individual channel up mix signals.

As already mentioned above, a big advantage of the inventive concept is its possibility to be placed within the MPEG surround coding scheme. The inventive concept on the one hand extends the functionality of the TP/TES tool since it implements the temporal shaping mechanism needed for proper handling of transient events or signals. On the other hand, the tool requires the transmission of side information to guide the shaping process. While the required average side information bit rate (ca. 5 KBit/s for continuous envelope transmission) is comparatively low, the gain in conceptual quality is significant. Consequently, the new concept is proposed as an addition to the existing TP/TES tools. In the sense of keeping computational complexity rather low while still maintaining high audio quality, the combination of the newly proposed concept with TES is a preferred operation mode. As it comes to computational complexity, it may be noted that some of the calculations required for the envelope extraction and reshaping on a per frame basis, while others are executed by slot (i.e. a time interval within the filter bank domain). The complexity is dependent on the frame length as well as on the sampling frequency. Assuming a frame length of 32 slots and a sampling rate of 44.1 KHz, the described algorithm requires approximately 105.000 operations per second (OPS) for the envelope extraction for one channel and 330.000 OPS for the reshaping of one channel. As one envelope extraction is required per down-mix channel and one reshaping operation is required for each output channel, this results in a total complexity of 1.76 MOPS for a 5-1-5 configuration, i.e. a configuration where 5 channels of a multi-channel audio signal are represented by a monophonic down-mix signal and 1.86 MOPS for the 5-2-5 configuration utilizing a stereo down-mix signal.

BRIEF DESCRIPTION OF THE DRAWINGS

Preferred embodiments of the present invention are subsequently described by referring to the enclosed drawings, wherein:

FIGS. 3*a* and 3*b* show a table assigning filter band indices of a hybrid filter bank to corresponding subband indices;

FIG. 4 shows parameters of different decoding configurations;

FIG. 5 shows a coding scheme illustrating the backwards compatibility of the inventive concept;

FIG. 6 shows parameter configurations selecting different configurations;

FIG. 7 shows a backwards-compatible coding scheme;

FIG. 7*b* illustrates different quantization schemes;

FIG. 8 further illustrates the backwards-compatible coding scheme;

FIG. 9 shows a Huffman codebook used for an efficient implementation;

FIG. 10 shows an example for a channel configuration of a multi-channel output signal;

DETAILED DESCRIPTION OF PREFERRED EMBODIMENTS

Figure 1:
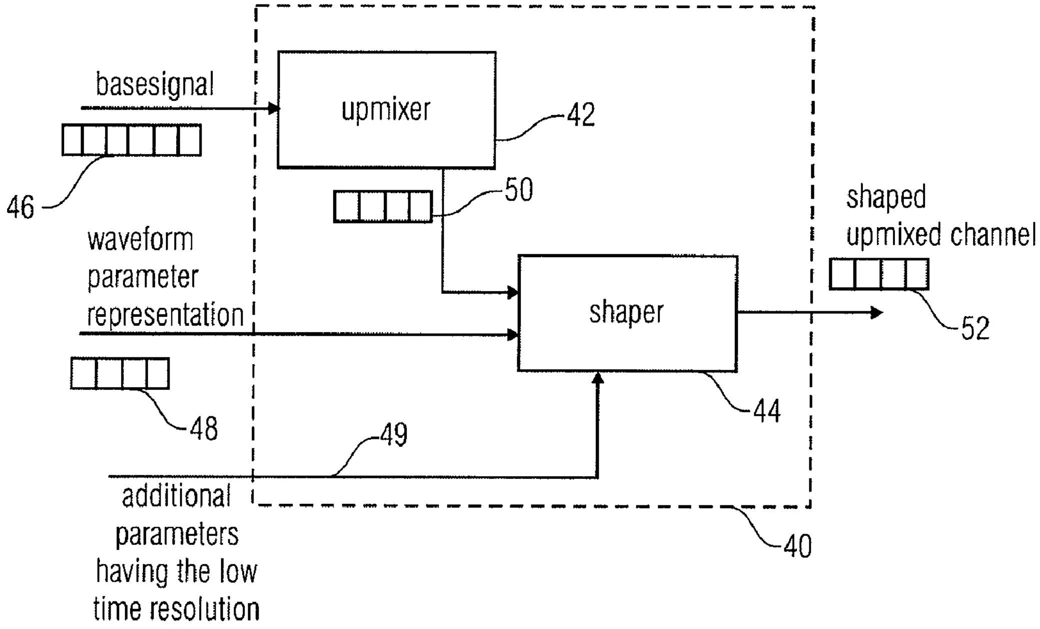
FIG. 1 shows an inventive decoder.

FIG. 1 shows an inventive decoder 40 having an upmixer 42 and a shaper 44.

The decoder 40 receives as an input a base signal 46 derived from an original multi-channel signal, the base signal having one or more channels, wherein the number of channels of the base signal is lower than the number of channels of the original multi-channel signal. The decoder 40 receives as second input a wave form parameter representation 48 representing a wave form of a low resolution representation of a selected original channel, wherein the wave form parameter representation 48 is including a sequence of wave form parameters having a time resolution that is lower than the time resolution of a sampling values that are organized in frames, the frames describing the base signal 46. The upmixer 42 is generating an upmix channel 50 from the base signal 46, wherein the upmix 50 is a low-resolution estimated representation of a selected original channel of the original multi-channel signal that is having a lower time resolution than the time resolution of the sampling values. The shaper 44 is receiving the upmix channel 50 and the wave form parameter representation 48 as input and derives a shaped up-mixed channel 52 which is shaped such that the envelope of the shaped upmixed channel 52 is adjusted to fit the envelope of the corresponding original channel within a tolerance range, wherein the time resolution is given by the time resolution of the wave form parameter representation.

Figure 15:
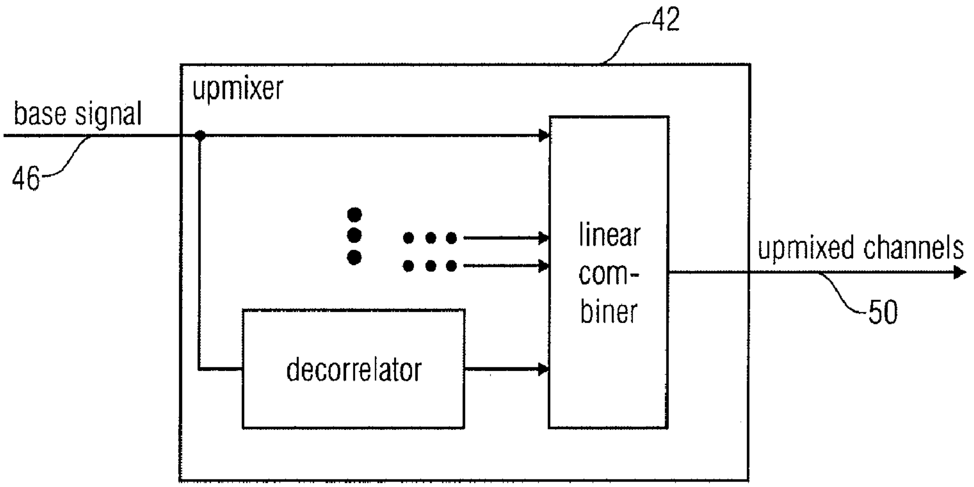
FIG. 15 illustrates an embodiment of an upmixer having one or more decorrelators.

FIG. 15 illustrates an embodiment of the upmixer 42, in which the upmixer 42 has one or more decorrelators for deriving one or more decorrelated signals from the base signal 46. Furthermore, the upmixer comprises a linear combiner, so that the upmixer is operative such that the generation of the upmixed channels includes a linear combination of the channels of the base signal and of the one or more decorrelated signals.

Figure 16:
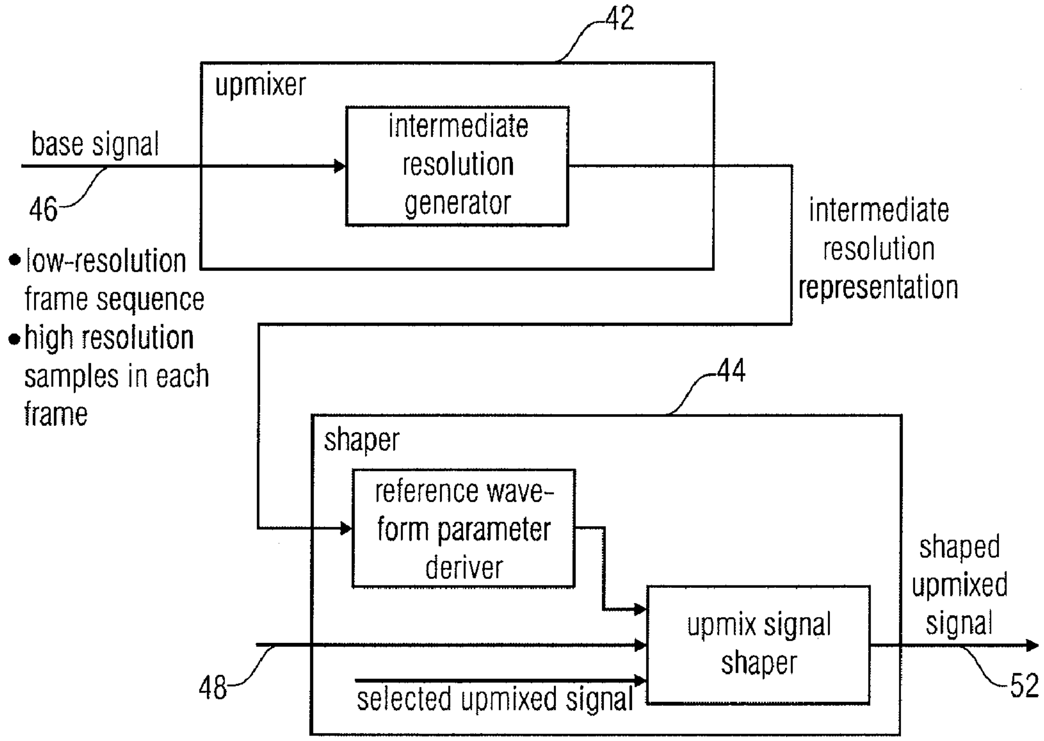
FIG. 16 illustrates an embodiment of a decoder where an intermediate resolutionary representation is used.

FIG. 16 illustrates the upmixer 42 which receives, as an input, a base signal 46 having a low-resolution frame sequence and high-resolution samples in each frame. The upmixer comprises an intermediate resolution generator, so that the upmixer 42 is operative to derive an intermediate resolution representation of the base signal, which is used to generate the upmixed channels. Furthermore, the shaper 44 comprises a reference waveform parameter deriver and an upmix signal shaper. Particularly, the shaper 44 is operative to derive a reference waveform parameter representation of the intermediate resolution representation of the base signal by the reference parameter deriver. Furthermore, the shaper 44 is configured for shaping the selected upmixed signal using the waveform parameter representation 48 and the reference waveform parameter representation by the upmix signal shaper.

Thus, the envelope of the shaped up-mixed channel can be shaped with a time resolution that is higher than the time resolution defined by the frames building the base signal 46. Therefore, the spatial redistribution of a reconstructed signal is guaranteed with a finer temporal granularity than by using the frames and the perceptional quality can be enhanced at the cost of a small increase of bit rate due to the wave form parameter representation 48.

In an embodiment, the shaper 44 is further adapted to shape the selected upmixed channel using additional parameters having the low time resolution as illustrated by 49 in FIG. 1.

Figure 2:
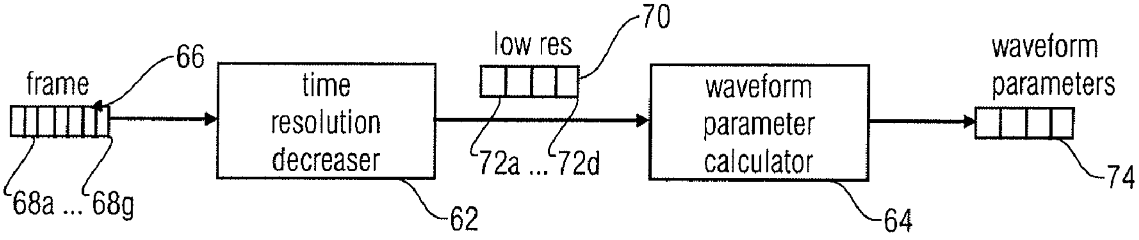
FIG. 2 shows an inventive encoder.

FIG. 2 shows an inventive encoder 60 having a time resolution decreaser 62 and a waveform parameter calculator 64. The encoder 60 is receiving as an input a channel of a multi-channel signal that is represented by frames 66, the frames comprising sampling values 68*a* to 68*g*, each sampling value representing a first sampling period. The time resolution decreaser 62 is deriving a low-resolution representation 70 of the channel in which a frame is having low-resolution values 72*a* to 72*d* that are associated to a low-resolution period being larger than the sampling period.

The wave form parameter calculator 64 receives the low resolution representation 70 as input and calculates wave form parameters 74, wherein the wave form parameters 74 are having a time resolution lower than the time resolution of the sampling values and higher than a time resolution defined by the frames.

The waveform parameters 74 are preferably depending on the amplitude of the channel within a time portion defined by the low-resolution period. In a preferred embodiment, the waveform parameters 74 are describing the energy that is contained within the channel in a low-resolution period. In a preferred embodiment, the waveform parameters are derived such that an energy measure contained in the waveform parameters 74 is derived relative to a reference energy measure that is defined by a down-mix signal derived by the inventive multi-channel audio encoder.

The application of the inventive concept in the context of an MPEG surround audio encoder is described in more detail within the following paragraphs to outline the inventive ideas.

The application of the inventive concept within the subband domain of a prior art MPEG encoder further underlines the advantageous backwards compatibility of the inventive concept to prior art coding schemes.

The present invention (guided envelope shaping) restores the broadband envelope of the synthesized output signal. It comprises a modified upmix procedure followed by envelope flattening and reshaping of the direct (dry) and the diffused (wet) signal portion of each output channel. For steering the reshaping parametric broadband envelope side information contained in the bit stream is used. The side information consists of ratios (envRatio) relating the transmitted downmix signals envelope to the original input channel signals envelope.

As the envelope shaping process employs an envelope extraction operation on different signals, the envelope extraction process shall first be described in more detail. It is to be noted that within the MPEG coding scheme the channels are manipulated in a representation derived by a hybrid filter bank, that is two consecutive filters are applied to an input channel. A first filter bank derives a representation of an input channel in which a plurality of frequency intervals are described independently by parameters having a time resolution that is lower than the time resolution of the sampling values of the input channel. These parameter bands are in the following denoted by the letter κ. Some of the parameter bands are subsequently filtered by an additional filter bank that is further subdividing some the frequency bands of the first filterbank in one or more finite frequency bands with representations that are denoted k in the following paragraphs. In other words, each parameter band κ may have associated more than one hybrid index k.

FIGS. 3*a* and 3*b* show a table associating a number of parameter bands to the corresponding hybrid parameters. The hybrid parameter k is given in the first column 80 of the table wherein the associated parameter band κ is given in one of the columns 82*a* or 82*b*. The application of column 82*a* or 82*b* is depending on a parameter 84 (decType) that indicates two different possible configurations of an MPEG decoder filterbank.

It is further to be noted that the parameters associated to a channel are processed in a frame-wise fashion, wherein a single frame is having n time intervals and wherein for each time interval n a single parameter y exists for every hybrid index k. The time intervals n are also called slots and the associated parameters are indicated $y^{n,k}$. For the estimation of the normalized envelope, the energies of the parameter bands are calculated with $y^{n,k}$ being the input signal for each slot in a frame:

$$E_{slot}^{n,\kappa} = \sum_{\tilde{k}} y^{n.k} y^{n,k*}, \tilde{k} = \{k \mid \overline{\kappa}(k) = \kappa\}$$

The summation includes all k being attributed to all parameter bands κ according to the table shown in FIGS. 3*a* and 3*b*.

Subsequently, the total parameter band energy in the frame for each parameter band is calculated as $$E_{frame}^{\kappa}(t+1) = (1-\alpha) \sum_{n=0}^{numSlots-1} E_{slot}^{n,\kappa} + \alpha E_{frame}^{\kappa}(t),$$

-continued $$\alpha = \exp\left(\frac{-1*64*numSlots}{0.4*sFreq}\right).$$

With α being a weighting factor corresponding to a first order IIR low pass with 400 ms time constant. t is denoting the frame index, sFreq the sampling rate of the input signal, and 64 represents the down-sample factor of the filter bank. The mean energy in a frame is calculated to be $$E_{total} = \frac{1}{\kappa_{stop} - \kappa_{start} + 1} \sum_{\kappa=\kappa_{start}}^{\kappa_{stop}} E_{frame}^{\kappa},$$

with $\kappa_{start}$=10 and $\kappa_{stop}$=18.

The ratio of these energies is determined to obtain weights for spectral whitening:

$$w^{\kappa} = \frac{E_{total}}{E_{frame}^{\kappa} + \varepsilon}$$

The broadband envelope is obtained by summation of the weighted contributions of the parameter bands, normalizing and calculation of the square root $$Env = \sqrt{\frac{\sum_{\kappa=\kappa_{start}}^{\kappa_{stop}} w^{\kappa} \cdot E_{slot}^{n,\kappa}(t+1)}{\sum_{n=0}^{numSlots-1} \sum_{\kappa=\kappa_{start}}^{\kappa_{stop}} w^{\kappa} \cdot E_{slot}^{n,\kappa}(t+1)}}.$$

After the envelope extraction, the envelope shaping process is performed, which is consisting of a flattening of the direct and the diffuse sound envelope for each output channel followed by a reshaping towards a target envelope. This is resulting in a gain curve being applied to the direct and the diffuse signal portion of each output channel.

In the case of a MPEG surround compatible coding scheme, a 5-1-5 and a 5-2-5 configuration have to be distinguished.

For 5-1-5 configuration the target envelope is obtained by estimating the envelope of the transmitted down mix $Env_{Dmx}$ and subsequently scaling it with encoder transmitted and requantized envelope ratios $envRatio^{L,Ls,C,R,Rs}$. The gain curve for all slots in a frame is calculated for each output channel by estimating the envelope $Env_{direct,diffuse}{}^{L,Ls,C,R,Rs}$ of the direct and the diffuse signal respectively and relate it to the target envelope $$g_{direct,diffuse}^{L,Ls,C,R,Rs} = \frac{envRatio^{L,Ls,C,R,Rs} \cdot Env_{Dmx}}{Env_{direct,diffuse}^{L,Ls,C,R,Rs}}$$

For 5-2-5 configurations the target envelope for L and Ls is derived from the left channel compatible transmitted down mix signal's envelope $Env_{DmxL}$, for R and Rs the right channel compatible transmitted down mix is used to obtain $Env_{DmxR}$. The center channel is derived from the sum of left and right compatible transmitted down mix signal's envelopes. The gain curve is calculated for each output channel by estimating the envelope $Env_{direct,diffuse}{}^{L,Ls,C,R,Rs}$ of the direct and the diffuse signal respectively and relate it to the target envelope $$g_{direct,diffuse}^{L,Ls} = \frac{envRatio^{L,Ls} \cdot Env_{DmxL}}{Env_{direct,diffuse}^{L,Ls}}$$

$$g_{direct,diffuse}^{R,Rs} = \frac{envRatio^{R,Rs} \cdot Env_{DmxR}}{Env_{direct,diffuse}^{R,Rs}}$$

$$g_{direct,diffuse}^{C} = \frac{envRatio^{C} \cdot 0.5(Env_{DmxL} + Env_{DmxR})}{Env_{direct,diffuse}^{C}}.$$

For all channels, the envelope adjustment gain curve is applied as $$y_{direct}{}^{n,k} = g_{direct}{}^{n} \cdot y_{direct}{}^{n,k}$$

$$y_{diffuse}{}^{n,k} = g_{diffuse}{}^{n} \cdot y_{diffuse}{}^{n,k}.$$

With k starting at the crossover hybrid subband $k_0$ and for n=0, . . . , numSlots−1.

After the envelope shaping of the wet and the dry signals separately, the shaped direct and diffuse sound is mixed within the subband domain according to the following formula:

$$y^{n,k} = y_{direct}{}^{n,k} + y_{diffuse}{}^{n,k}$$

It has been shown in the previous paragraphs that it is advantageously possible to implement the inventive concept within a prior art coding scheme which is based on MPEG surround coding. The present invention also makes use of an already existing subband domain representation of the signals to be manipulated, introducing little additional computational effort. To increase the efficiency of an implementation of the inventive concept into MPEG multi-channel audio coding, some additional changes in the upmixing and the temporal envelope shaping are preferred.

If the guided envelope shaping is enabled, direct and diffuse signals are synthesized separately using a modified post mixing in the hybrid subband domain according to $$y_{direct}^{n,k} = \begin{cases} M_{2\_dry}^{n,k} w^{n,k} + M_{2\_wet}^{n,k} w^{n,k}, & 0 \le k < k_0 \\ M_{2\_dry}^{n,k} w^{n,k}, & k_0 \le k < K \end{cases}$$

$$y_{diffuse}^{n,k} = \begin{cases} 0, & 0 \le k < k_0 \\ M_{2\_wet}^{n,k} w^{n,k}, & k_0 \le k < K. \end{cases}$$

with $k_0$ denoting the crossover hybrid subband.

As can be seen from the above equations, the direct outputs hold the direct signal, the diffuse signal for the lower bands and the residual signal (if present). The diffuse outputs provide the diffuse signal for the upper bands.

Here, $k_0$ is denoting the crossover hybrid subband according to FIG. 4. FIG. 4 shows a table that is giving the crossover hybrid subband $k_0$ in dependence of the two possible decoder configurations indicated by parameter 84 (decType).

If TES is used in combination with guided envelope shaping, the TES processing is slightly adapted for optimal performance:

Instead of the downmix signals, the reshaped direct upmix signals are used for the shaping filter estimation:

$$x_c = y_{direct,c}$$

Independent of the 5-1-5 or 5-2-5 mode all TES calculations are performed accordingly on a per-channel basis. Furthermore, the mixing step of direct and diffuse signals is omitted in the guided envelope shaping then as it is performed by TES.

If TP is used in combination with the guided envelope shaping the TP processing is slightly adapted for optimal performance:

Instead of a common downmix (derived from the original multi-channel signal) the reshaped direct upmix signal of each channel is used for extracting the target envelope for each channel.

$$\hat{y}_{direct}=\tilde{y}_{direct}$$

Independent of the 5-1-5 or 5-2-5 mode all TP calculations are performed accordingly on a per-channel basis. Furthermore, the mixing step of direct and diffuse signal is omitted in the guided envelope shaping and is performed by TP.

To further emphasize and give proof for a backwards compatibility of the inventive concept with MPEG audio coding, the following figures show bit stream definitions and functions defined to be fully backwards compatible and additionally supporting quantized envelope reshaping data.

FIG. 5 shows a general syntax describing the spatial specific configuration of a bit stream.

In a first part 90 of the configuration, the variables are related to prior art MPEG encoding defining for example whether residual coding is applied or giving indication about the decorrelation schemes to apply. This configuration can easily be extended by a second part 92 describing the modified configuration when the inventive concept of guided envelope shaping is applied.

In particular, the second part utilizes a variable bsTempShapeConfig, indicating the configuration of the envelope shaping applicable by a decoder.

FIG. 6 shows a backwards compatible way of interpreting the four bits consumed by said variable. As can be seen from FIG. 6, variable values of 4 to 7 (indicated in line 94) indicate the use of the inventive concept and furthermore a combination of the inventive concept with the prior art shaping mechanisms TP and TES.

FIG. 7 outlines the proposed syntax for an entropy coding scheme as it is implemented in a preferred embodiment of the present invention. Additionally the envelope side information is quantized with a five step quantization rule.

In a first part 100 of the pseudo-code presented in FIG. 7 temporal envelope shaping is enabled for all desired output channels, wherein in a second part 102 of the code presented envelope reshaping is requested. This is indicated by the variable bsTempShapeConfig shown in FIG. 6.

In a preferred embodiment of the present invention, five step quantization is used and the quantized values are jointly encoded together with the information, whether one to eight identical consecutive values occurred within the bit stream of the envelope shaping parameters.

It should be noted that, in principle, a finer quantization as the proposed five step quantization is possible, which can then be indicated by a variable bsEnvquantMode as shown in FIG. 7*b*. Although principally possible, the present implementation introduces only one valid quantization.

FIG. 8 shows code that is adapted to derive the quantized parameters from the Huffman encoded representation. As already mentioned, the combined information regarding the quantized value and the number of repetitions of the value in question are represented by a single Huffman code word. The Huffman decoding therefore comprises a first component 104 initiating a loop over the desired output channels and a second component 106 that is receiving the encoded values for each individual channel by transmitting Huffman code words and receiving associated parameter values and repetition data as indicated in FIG. 9.

FIG. 9 is showing the associated Huffman code book that has 40 entries, since for the 5 different parameter values 110 a maximum repetition rate of 8 is foreseen. Each Huffman code word 112 therefore describes a combination of the parameter 110 and the number of consecutive occurrence 114.

Given the Huffman decoded parameter values, the envelope ratios used for the guided envelope shaping are obtained from the transmitted reshaping data according to the following equation:

$$envRatio^{X,n} = 2^{\frac{envShapeData[oc][n]}{2}},$$

with n=0, . . . , numSlots−1 and X and oc denoting the output channel according to FIG. 10.

FIG. 10 shows a table that is associating the loop variable oc 120, as used by the previous tables and expressions with the output channels 122 of a reconstructed multichannel signal.

As it has been demonstrated by FIGS. 3*a* to 9, an application of the inventive concept to prior art coding schemes is easily possible, resulting in an increase in perceptual quality while maintaining fully backwards compatibility.

Figure 11:
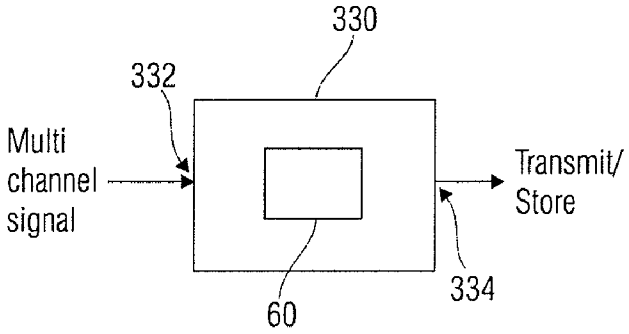
FIG. 11 shows an inventive transmitter or audio recorder.

FIG. 11 is showing an inventive audio transmitter or recorder 330 that is having an encoder 60, an input interface 332 and an output interface 334.

An audio signal can be supplied at the input interface 332 of the transmitter/recorder 330. The audio signal is encoded by an inventive encoder 60 within the transmitter/recorder and the encoded representation is output at the output interface 334 of the transmitter/recorder 330. The encoded representation may then be transmitted or stored on a storage medium.

Figure 12:
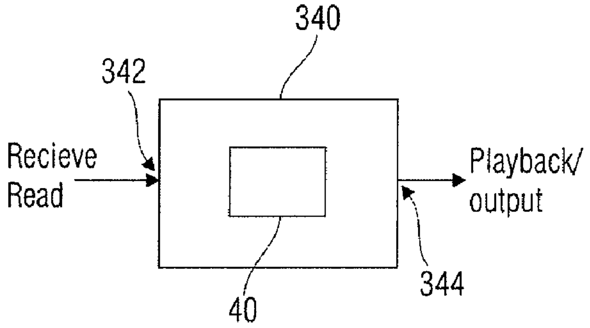
FIG. 12 shows an inventive receiver or audio player.

FIG. 12 shows an inventive receiver or audio player 340, having an inventive decoder 40, a bit stream input 342, and an audio output 344.

A bit stream can be input at the input 342 of the inventive receiver/audio player 340. The bit stream then is decoded by the decoder 40 and the decoded signal is output or played at the output 344 of the inventive receiver/audio player 340.

Figure 13:
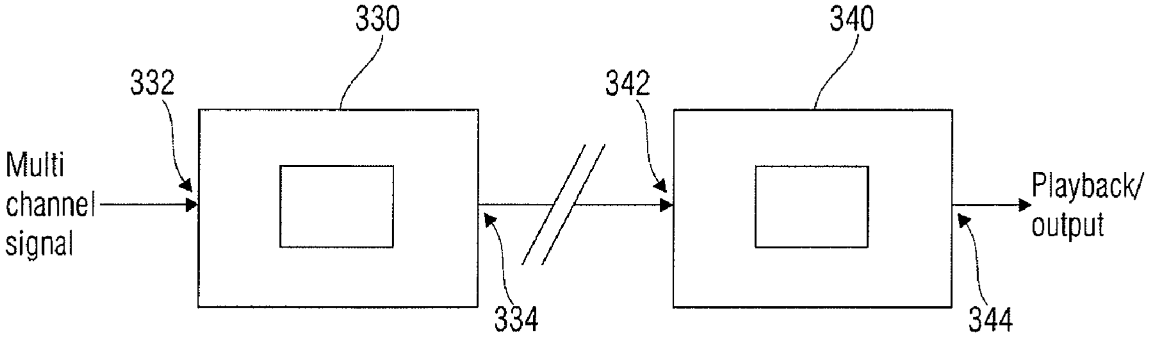
FIG. 13 shows an inventive transmission system.
Figure 14:
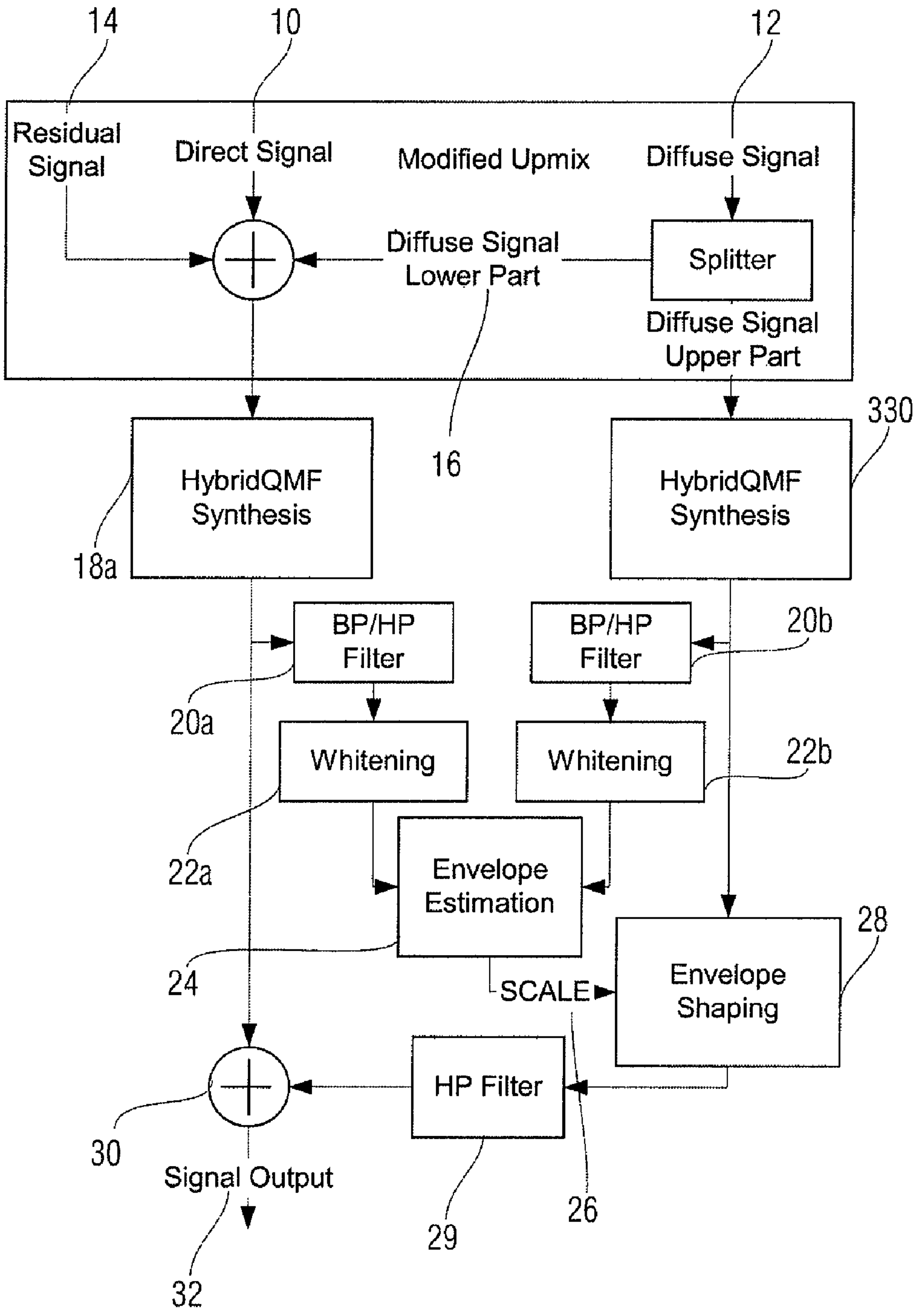
FIG 14 (PRIOR ART)
FIG. 14 illustrates prior art time domain temporal shaping.

FIG. 13 shows a transmission system comprising an inventive transmitter 330, and an inventive receiver 340.

The audio signal input at the input interface 332 of the transmitter 330 is encoded and transferred from the output 334 of the transmitter 330 to the input 342 of the receiver 340. The receiver decodes the audio signal and plays back or outputs the audio signal on its output 344.

Summarizing, the present invention provides improved solutions by describing e.g.

- a way of calculating a suitable and stable broadband envelope which minimizes perceived distortion
- an optimized method to encode the envelope side information in a way that it is represented relative to (normalized to) the envelope of the downmix signal and in this way minimizes bitrate overhead
- a quantization scheme for the envelope information to be transmitted
- a suitable bitstream syntax for transmission of this side information
- an efficient method of manipulating broadband envelopes in the QMF subband domain a concept how the processing types (1) and (2), as described above, can be unified within a single architecture which is able to recover the fine spatial distribution of the multi-channel signals over time, if a spatial side information is available describing the original temporal channel envelopes. If no such information is sent in the spatial bitstream (e.g. due to constraints in available side information bitrate), the processing falls back to a type (1) processing which still can carry out correct temporal shaping of the decorrelated sound (although not on a channel individual basis).

Although the inventive concept described above has been extensively described in its application to existing MPEG coding schemes, it is obvious that the inventive concept can be applied to any other type of coding where spatial audio characteristics have to be preserved.

The inventive concept of introducing or using a intermediate signal for shaping the envelope i.e. the energy of a signal with an increased time resolution can be applied not only in the frequency domain, as illustrated by the figures but also in the time domain, where for example a decrease in time resolution and therefore a decrease in required bit rate can be achieved by averaging over consecutive time slices or by only taking into account every n-th sample value of a sample representation of an audio signal.

Although the inventive concept as illustrated in the previous paragraphs incorporates a spectral whitening of the processed signals the idea of having an intermediate resolution signal can also be incorporated without spectral whitening.

Depending on certain implementation requirements of the inventive methods, the inventive methods can be implemented in hardware or in software. The implementation can be performed using a digital storage medium, in particular a disk, DVD or a CD having electronically readable control signals stored thereon, which cooperate with a programmable computer system such that the inventive methods are performed. Generally, the present invention is, therefore, a computer program product with a program code stored on a machine-readable carrier, the program code being operative for performing the inventive methods when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

The invention claimed is:

1. Decoder for generating a multi-channel output signal based on a base signal derived from an original multi-channel signal having one or more channels, the number of channels of the base signal being smaller than the number of channels of the original multi-channel signal, the base signal having a frame, the frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, comprising:

an upmixer for generating a plurality of upmixed channels having a time resolution higher than the intermediate resolution and for deriving an intermediate resolution representation of the base signal used to generate the upmixed channels; and a shaper for deriving a reference wave form parameter representation of the intermediate resolution representation of the base signal and for shaping a selected upmixed channel using the reference wave form parameter representation and the intermediate waveform parameters of the selected original channel corresponding to the selected upmixed channel.

2. Decoder in accordance with claim 1, in which the upmixer is further operative to derive an intermediate resolution representation of the base signal.

3. Decoder in accordance with claim 2, in which the upmixer is operative to derive the intermediate resolution representation of the base signal using a filter bank, wherein the intermediate resolution representation of the base signal is derived in a filter bank domain.

4. Decoder in accordance with claim 3, in which the filter bank is a complex modulated filter bank.

5. Decoder in accordance with claim 3 in which the shaper is operative to shape the selected upmixed channel in the time domain.

6. Decoder in accordance with claim 1, in which the upmixer is having one or more decorrelators for deriving one or more decorrelated signals from the base signal.

7. Decoder in accordance with claim 6, in which the upmixer is operative such that the generation of the upmixed channels includes a linear combination of the channels of the base signal and of the one or more decorrelated signals.

8. Decoder in accordance with claim 7, in which the shaper is operative to shape a selected upmixed channel such that a first part of the selected upmixed channel derived from the base signal is shaped independently from a second part of the selected upmixed channel derived from the one or more decorrelated signals.

9. Decoder in accordance with claim 1, in which the shaper is operative to use intermediate wave form parameters describing a signal strength measure of the intermediate resolution representation of the selected channel.

10. Decoder in accordance with claim 9, in which the shaper is operative to use intermediate wave form parameters describing a signal strength measure having an amplitude or an energy measure.

11. Decoder in accordance with claim 1, in which the shaper is operative to derive a spectrally flat representation of the intermediate resolution representation of the base signal, the spectrally flat representation having a flat frequency spectrum, and to derive the reference wave form parameter representation from the spectrally flat representation.

12. Decoder in accordance with claim 1, in which the shaper is further adapted to shape the selected upmixed channel using additional wave form parameters having the low time resolution defined by the frame repetition rate.

13. Decoder in accordance with claim 1, further having an output interface to generate the multi-channel output signal having the high time resolution using the shaped selected upmixed channel.

14. Decoder in accordance with claim 13, in which the output interface is operative to generate the multi-channel output signal such that the generation of the multi-channel output signal comprises a synthesis of a filter bank representation of a plurality of shaped upmixed channels resulting in a time domain representation of the plurality of shaped upmixed channels having the high time resolution.

15. Decoder in accordance with claim 1, in which the shaper is having a dequantizer for deriving the wave form parameter representation from a quantized representation of the same, using a dequantization rule having less than 10 quantization steps.

16. Decoder in accordance with claim 15, in which the shaper is having an entropy decoder for deriving the quantized representation of the wave form parameter representation from an entropy encoded representation of the same.

17. Decoder in accordance with claim 16, in which the entropy decoder is operative to use a Huffman codebook for deriving the quantized representation of the wave form parameter representation.

18. Decoder in accordance with claim 1, in which the shaper is operative to shape the selected upmixed channel such that the shaping comprises a combination of the parameters from the wave form parameter representation and from the reference wave form parameter representation.

19. Method for generating a multi-channel output signal based on a base signal derived from an original multi-channel signal having one or more channels, the number of channels of the base signal being smaller than the number of channels of the original multi-channel signal, the base signal having a frame, the frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, the method comprising:

deriving an intermediate resolution representation of the base signal used to generate the upmixed channels;

generating a plurality of upmixed channels having a time resolution higher than the intermediate resolution;

deriving a reference wave form parameter representation of the intermediate resolution representation of the base signal; and shaping a selected upmixed channel using the reference wave form parameter representation and the intermediate waveform parameters of the selected original channel corresponding to the selected upmixed channel.

20. Receiver or audio player having a decoder for generating a multi-channel output signal based on a base signal derived from an original multi-channel signal having one or more channels, the number of channels of the base signal being smaller than the number of channels of the original multi-channel signal, the base signal having a frame, the frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, comprising:

an upmixer for generating a plurality of upmixed channels having a time resolution higher than the intermediate resolution and for deriving an intermediate resolution representation of the base signal used to generate the upmixed channels; and a shaper for deriving a reference wave form parameter representation of the intermediate resolution representation of the base signal and for shaping a selected upmixed channel using the reference wave form parameter representation and the intermediate waveform parameters of the selected original channel corresponding to the selected upmixed channel.

21. Method of receiving or audio playing, the method having a method for generating a multi-channel output signal based on a base signal derived from an original multi-channel signal having one or more channels, the number of channels of the base signal being smaller than the number of channels of the original multi-channel signal, the base signal having a frame, the frame comprising sampling values having a high resolution, and based on a wave form parameter representation representing a wave form of an intermediate resolution representation of a selected original channel of the original multi-channel signal, the wave form parameter representation including a sequence of intermediate wave form parameters having an intermediate time resolution lower than the high time resolution of the sampling values and higher than a low time resolution defined by a frame repetition rate, the method comprising:

deriving an intermediate resolution representation of the base signal used to generate the upmixed channels;

generating a plurality of upmixed channels having a time resolution higher than the intermediate resolution;

deriving a reference wave form parameter representation of the intermediate resolution representation of the base signal; and shaping a selected upmixed channel using the intermediate waveform parameters of the selected original channel corresponding to the selected upmixed channel.

22. Digital storage medium having stored thereon a computer program having a program code for, when running a computer, performing any of the methods of claim 19 or claim 21.

* * * * *